US007180323B2

(12) United States Patent
Kim et al.

(10) Patent No.: US 7,180,323 B2
(45) Date of Patent: Feb. 20, 2007

(54) THIN FILM TRANSISTOR LIQUID CRYSTAL DISPLAY (TFT-LCD) SOURCE DRIVER FOR IMPLEMENTING A SELF BURN-IN TEST AND A METHOD THEREOF

(75) Inventors: Kyung-Wol Kim, Seoul (KR); Yong-Weon Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 86 days.

(21) Appl. No.: 11/018,966

(22) Filed: Dec. 21, 2004

(65) Prior Publication Data

US 2005/0162374 A1 Jul. 28, 2005

(30) Foreign Application Priority Data

Jan. 14, 2004 (KR) ...................... 10-2004-0002669

(51) Int. Cl.
*G01R 31/00* (2006.01)

(52) U.S. Cl. ...................................................... 324/770

(58) Field of Classification Search ................ 324/765, 324/760, 158.1; 714/736, 738, 819; 349/73, 349/74, 108; 345/98, 100, 78, 204
See application file for complete search history.

(56) References Cited

U.S. PATENT DOCUMENTS 6,008,801 A * 12/1999 Jeong ......................... 345/204
6,724,362 B2 * 4/2004 Min ........................... 345/100
6,747,626 B2 * 6/2004 Chiang ........................ 345/98

FOREIGN PATENT DOCUMENTS

JP 10-69257 3/1998
JP 2002-32053 1/2002
JP 2002-341819 11/2002

OTHER PUBLICATIONS

English Abstract Only.

* cited by examiner

*Primary Examiner*—Ha Tran Nguyen
*Assistant Examiner*—Tung X. Nguyen
(74) *Attorney, Agent, or Firm*—F. Chau & Associates, LLC

(57) ABSTRACT

A thin film transistor liquid crystal display (TFT-LCD) source driver for implementing a self burn-in test and a self burn-in test method are provided. The TFT-LCD source driver includes a self burn-in signal generator that generates a self burn-in signal and a burn-in load signal, a burn-in data generator that generates a burn-in data signal and a burn-in polarity control signal in response to the self burn-in signal and a clock signal. The TFT-LCD source driver also includes first and second switching units. The first switching unit transmits the burn-in load signal as an internal load signal, transmits the burn-in data signal as an internal digital data signal, and transmits the burn-in polarity control signal as an internal polarity control signal, in response to activation of the self burn-in signal. The second switching unit transmits outputs of output drivers to all channels of the TFT-LCD source driver in response to the internal load signal.

5 Claims, 4 Drawing Sheets

THIN FILM TRANSISTOR LIQUID CRYSTAL DISPLAY (TFT-LCD) SOURCE DRIVER FOR IMPLEMENTING A SELF BURN-IN TEST AND A METHOD THEREOF

CROSS-REFERENCE TO RELATED APPLICATION

This application claims priority to Korean Patent Application No. 2004-2669, filed on Jan. 14, 2004, in the Korean Intellectual Property Office, the disclosure of which is incorporated herein in its entirety by reference.

FIELD OF THE INVENTION

The present invention relates to a method of testing the reliability of a thin film transistor liquid crystal display (TFT-LCD) source driver, and more particularly, to a TFT-LCD source driver that employs a self burn-in test.

DESCRIPTION OF THE RELATED ART

A thin film transistor liquid crystal display (TFT-LCD) includes a gate driver for driving gate lines of TFTs and a source driver for driving source lines of the TFTs. The gate driver applies a high voltage to the TFTs to turn them on, and the source driver applies source driving signals representing colors to the source lines of the TFTs to display an image on the TFT-LCD.

FIG. 1 is a block diagram of a conventional TFT-LCD source driver. Referring to FIG. 1, the TFT-LCD source driver includes a shift register 105 that generates synchronization clock signals SCLK<128:1> in response to a clock signal CLK, a digital controller 110 that receives digital data D00-Dxx and outputs digital R, G and B data, and a data register 120 that stores the digital R, G and B data in response to the synchronization clock signals SCLK<128:1> generated by the shift register 105. The TFT-LCD source driver further includes a data latch 130 that simultaneously stores the digital R, G and B data in response to a first clock signal CLK1, a digital-analog converter 140 that converts the digital R, G and B data of the data latch 130 into analog signals, and an output buffer 150 that buffers the output signals of the digital-analog converter 140 to provide the output signals to source lines of a TFT-LCD. The TFT-LCD source driver includes 384 channels, for example, Y1 through Y384. An output voltage of each of the channels of the TFT-LCD source driver is represented by 64 gray levels.

Every three channels of the 384 channels are used as R, G and B display voltages for one dot of the TFT-LCD. Digital R, G and B data for each channel are sequentially stored in the data register 120 in response to the synchronization clock signals SCLK<128:1> in order to simultaneously output display voltages of all dots of the TFT-LCD. Here, because the data register 120 receives digital R, G and B data for three channels at a time in response to a single synchronization clock signal SCLK, at least 128 synchronization clock signals SCLK are required to store input data for the 384 channels. Furthermore, 16,384 (=128×64×2) clock signals CLK are required to test 64 gray levels for each channel and to test for positive or negative polarity.

FIG. 2 is a flowchart illustrating a conventional method of testing the reliability of a TFT-LCD source driver. Referring to FIG. 2, a clock signal CLK, a polarity signal POL, and as many input data with a gray level 0 as the number of channels of the TFT-LCD source driver, are provided to the TFT-LCD source driver in step 210. A load signal LOAD is generated in step 220, and then analog signals are output to the channels though an output buffer of the TFT-LCD source driver in step 230. Then, the gray level is increased by 1 in step 250, and steps 210, 220, and 230 are repeated. When the gray level reaches 64 in step 240, steps 210 through 240 are repeated for an opposite polarity signal POL, and then the test is finished.

As described above, the conventional test method is similar to the normal operation of the conventional TFT-LCD source driver. Accordingly, a period of time required for activating the clock signal CLK, the polarity signal POL, and the load signal LOAD, and a clocking time required for applying input data to each channel, increase a test time of the conventional TFT-LCD source driver. Therefore, a self burn-in test that can reduce the test time of the conventional TFT-LCD source driver is desired.

SUMMARY OF THE INVENTION

The present invention provides a self burn-in test method of a thin film transistor liquid crystal display (TFT-LCD) source driver and a TFT-LCD source driver for implementing a self burn-in test. The TFT-LCD source driver for implementing a self burn-in test and method thereof reduces a typical burn-in test time of a TFT-LCD source driver and omits operations for generating burn-in signals, thus resulting in decreased cost for the self burn-in test.

According to an aspect of the present invention, there is provided a burn-in test method of a TFT-LCD source driver, comprising generating a self burn-in test signal; initializing the source driver in response to the self burn-in test signal to generate a polarity control signal at a first logic level and a burn-in data signal at a first gray level; outputting a driving voltage corresponding to the first gray level to all channels of the source driver; increasing the first gray level by 1 and outputting a driving voltage corresponding to the increased gray level to all the channels of the source driver; and repeating the step of increasing the first gray level by 1 and outputting a driving voltage corresponding to the increased gray level to all the channels of the source driver until the gray level reaches a highest gray level.

The burn-in test method may further include generating a polarity control signal at a second logic level, outputting a driving voltage corresponding to the first gray level to all the channels of the source driver, increasing the first gray level by 1 and outputting a driving voltage corresponding to the increased gray level to all the channels of the source driver, and repeating the step of increasing the first gray level by 1 and outputting a driving voltage corresponding to the increased gray level to all the channels of the source driver until the gray level reaches the highest gray level.

According to another aspect of the present invention, there is provided a TFT-LCD source driver comprising a self burn-in signal generator that generates a self burn-in signal and a self burn-in load signal in response to a burn-in test enable signal; a burn-in data generator that generates a burn-in data signal and a burn-in polarity control signal in response to the self burn-in signal and a clock signal; and a first switching unit that transmits the burn-in load signal as an internal load signal, transmits the burn-in data signal as an internal digital data signal, and transmits the burn-in polarity control signal as an internal polarity control signal, in response to the activation of the self burn-in signal. The TFT-LCD source driver further comprises a digital-analog converting unit that converts the internal polarity control signal and the internal digital data into analog signals; an output driver unit that outputs the output signals of the digital-analog converting unit as driving voltages; and a second switching unit that transmits the output signals of the output driver unit to channels of the source driver in response to the internal load signal. The clock signal is provided by an external device located outside the TFT-LCD source driver, or automatically provided by a ring counter set in the TFT-LCD source driver.

According to yet another aspect of the present invention, a method for performing a burn-in test using a TFT-LCD source driver, comprises: generating a self burn-in signal and a burn-in load signal in response to a burn-in test enable signal; generating a burn-in data signal and a burn-in polarity control signal in response to the self burn-in signal and a clock signal; switching off an external load signal and transmitting the burn-in load signal as an internal load signal in response to the self burn-in signal; switching off an external data signal and transmitting the burn-in data signal as an internal data signal; switching off an external polarity control signal and transmitting the burn-in polarity control signal as an internal polarity control signal; converting the internal data signal and internal polarity control signal into analog signals; outputting the analog signals as driving voltages; and outputting the driving voltages to channels of the source driver in response to the internal load signal.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
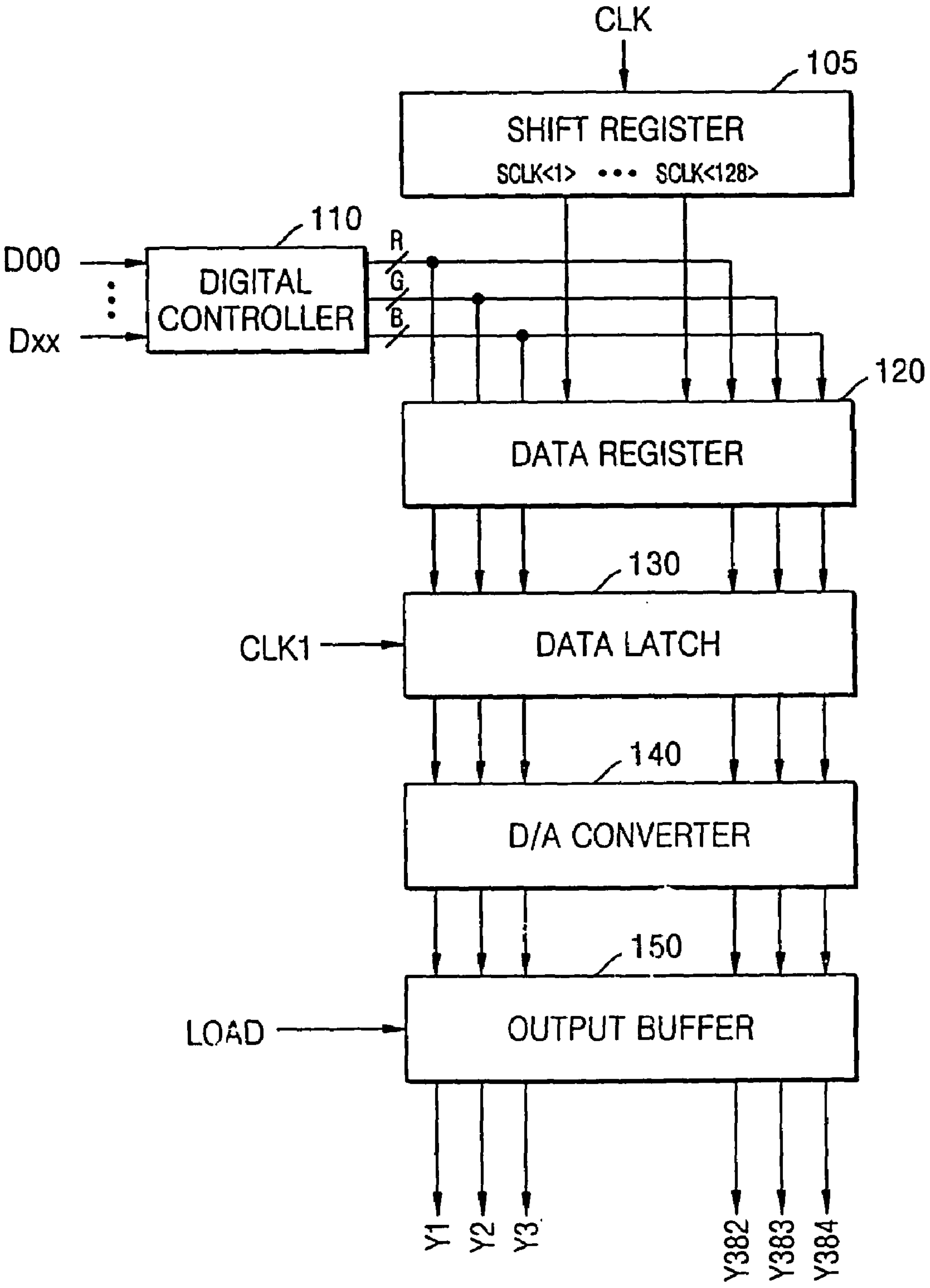
FIG. 1 (PRIOR ART)
FIG. 1 is a block diagram of a conventional thin film transistor liquid crystal display (TFT-LCD) source driver.
Figure 2:
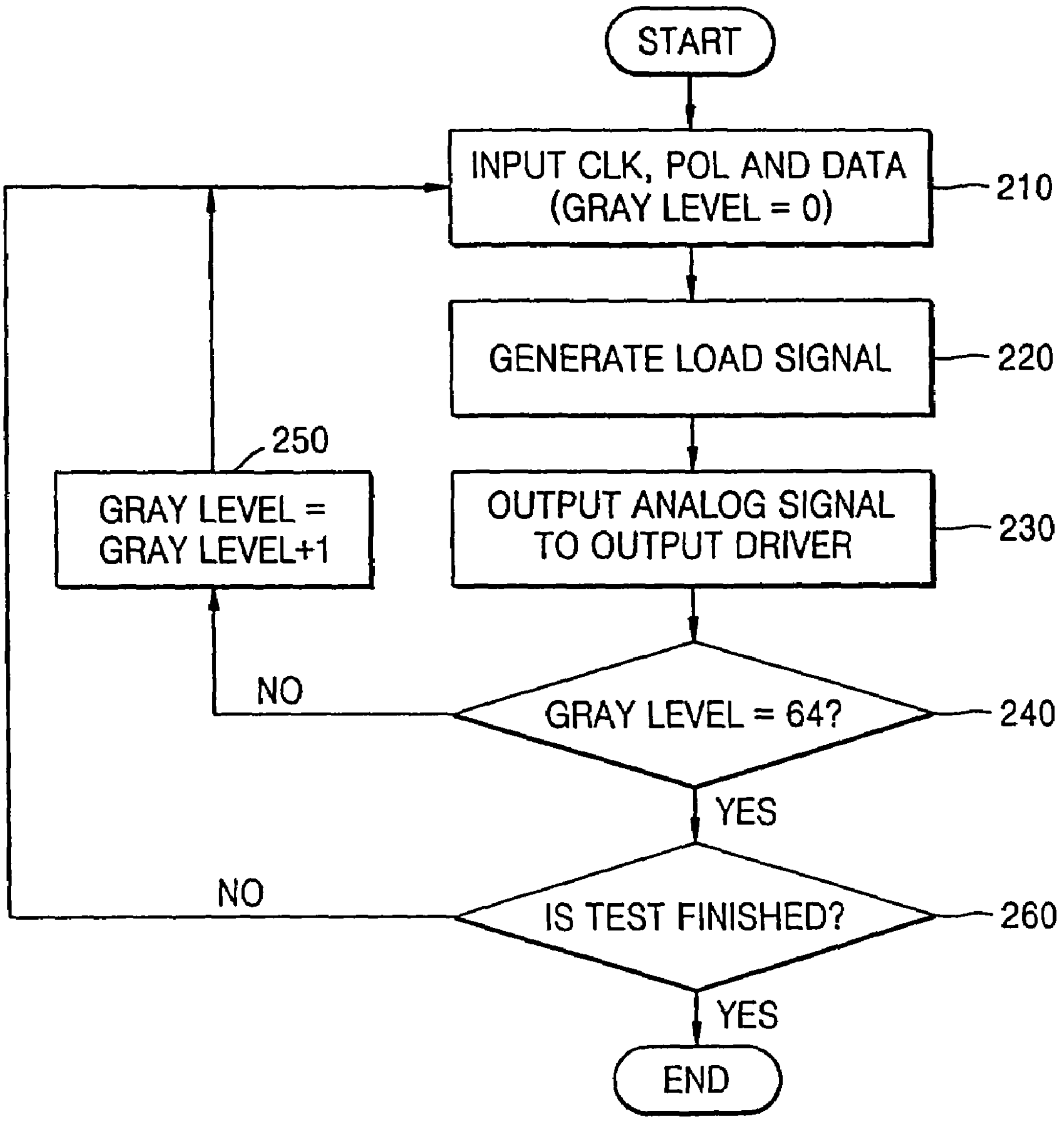
FIG. 2 (PRIOR ART)
FIG. 2 is a flowchart illustrating a conventional method of testing the reliability of a TFT-LCD source driver.
Figure 3:
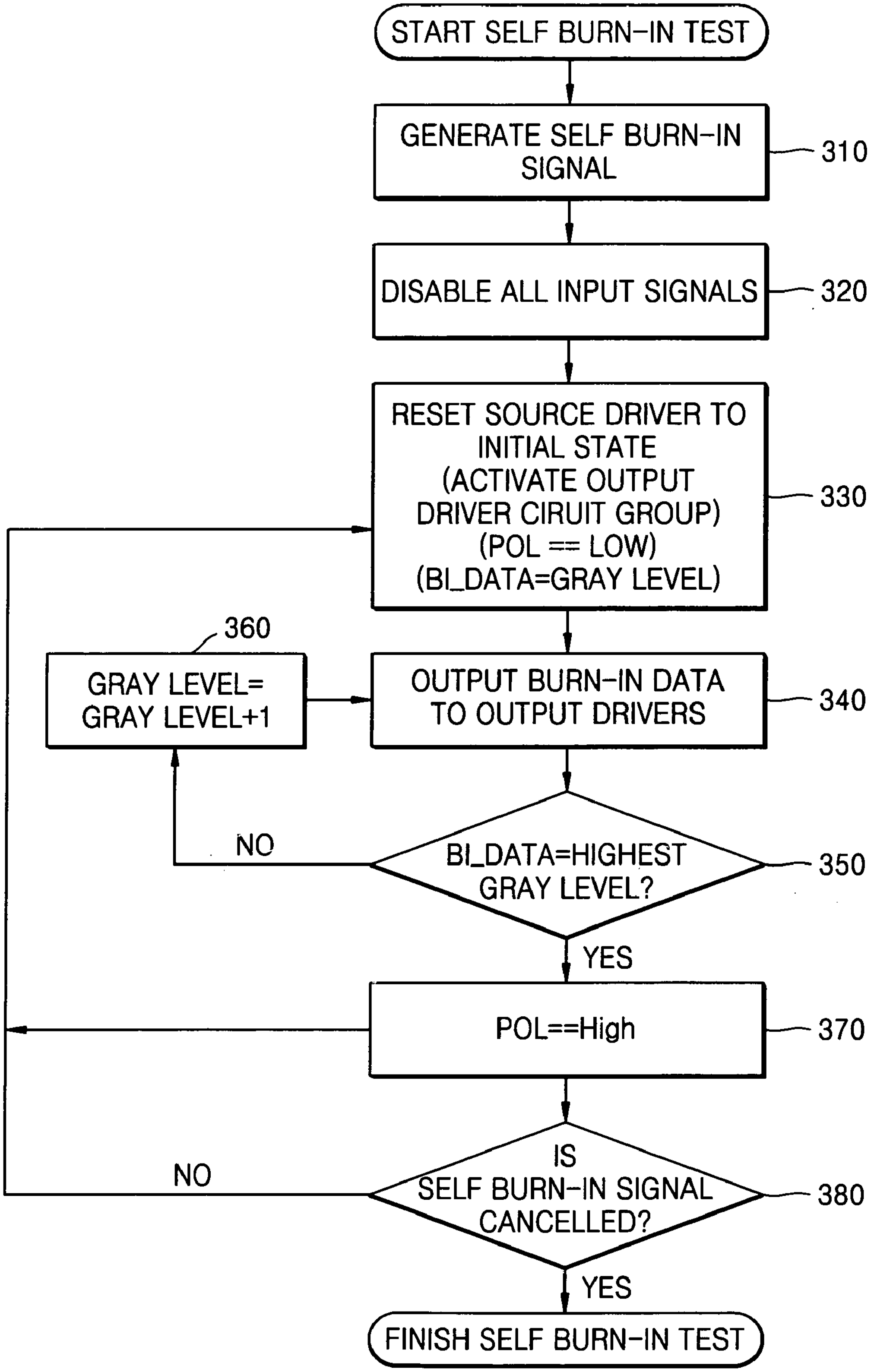
FIG. 3 is a flowchart illustrating a method of testing the reliability of a TFT-LCD source driver according to an exemplary embodiment of the present invention.

FIG. 3 is a flowchart illustrating a self burn-in test method of a thin film transistor liquid crystal display (TFT-LCD) source driver according to an exemplary embodiment of the present invention. Referring to FIG. 3, when a self burn-in signal is generated in step 310, all external input signals are disabled in step 320, and the TFT-LCD source driver is reset to an initial state in step 330. In step 330, an output driver circuit group of the TFT-LCD source driver is activated, and a polarity signal POL and burn-in data BI_DATA are set to a logic low level and a gray level 0, respectively. Then, the burn-in data BI_DATA with a gray level of 0 is output to all output drivers of the TFT-LCD source driver in step 340.

In step 350, it is confirmed whether the burn-in data BI_DATA is at the highest gray level, for example, 64. When the burn-in data BI_DATA is not at the highest gray level, the current gray level of the burn-in data BI_DATA is increased by 1 in step 360, and the burn-in data BI_DATA is output to all the output drivers of the TFT-LCD source driver in step 340. That is, the steps 340, 350 and 360 are repeated until the burn-in data BI_DATA reaches the highest gray level.

Subsequently, the polarity signal POL is shifted to a logic high level in step 370, to reset the TFT-LCD source driver to the initial state in which the burn-in data BI_DATA is set to the gray level 0 in step 330. Then, the burn-in data BI_DATA with the gray level 0 is output to all the output drivers in step 340. Subsequently, the burn-in data BI_DATA with a corresponding gray level is output to all the output drivers while the gray level of the burn-in data BI_DATA is increased by 1 until it reaches the highest gray level.

When the self burn-in signal is cancelled in step 380, the self burn-in test is finished. In this embodiment, the polarity signal POL is set to a logic low level and the test is carried out while the gray level of the burn-in data BI_DATA is increased by 1. Then, the polarity signal POL is shifted to a logic high level and the test is performed while the gray level of the burn-in data BI_DATA is increased by 1. However, it is also possible to first set the polarity signal POL to a logic high level, carry out the test, and then set the polarity signal POL to a logic low level and carry out the test a second time.

Figure 4:
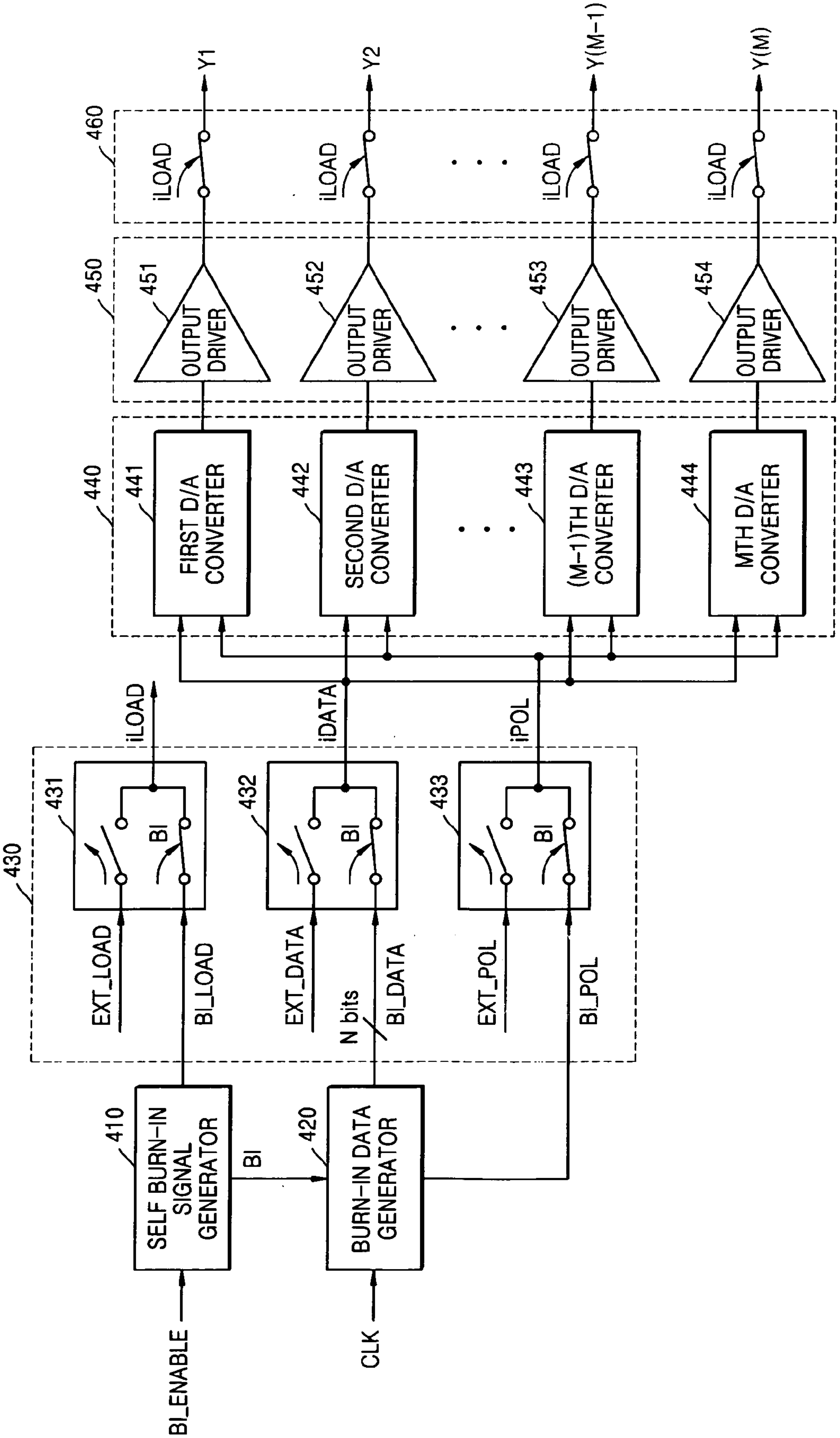
FIG. 4 is a block diagram of a TFT-LCD source driver according to an exemplary embodiment of the present invention.

FIG. 4 is a block diagram of a TFT-LCD source driver for implementing the self burn-in test according to an exemplary embodiment of the present invention. Referring to FIG. 4, the TFT-LCD source driver includes a self burn-in signal generator 410, a burn-in data generator 420, a first switching unit 430, a digital-analog converting unit 440, an output driver unit 450, and a second switching unit 460.

The self burn-in signal generator 410 generates a self burn-in signal BI and a burn-in load signal BI_LOAD in response to a burn-in test enable signal BI_ENABLE. The burn-in data generator 420 generates burn-in data BI_DATA and a burn-in polarity control signal BI_POL in response to the self burn-in signal BI and a clock signal CLK.

The first switching unit 430 includes a switch 431 that switches off an external load signal EXT_LOAD input thereto and transmits the burn-in load signal BI_LOAD as an internal load signal iLOAD in response to the self burn-in signal BI, a switch 432 that switches off external data EXT_DATA input thereto and transmits the burn-in data BI_DATA as internal data iDATA, and a switch 433 that switches off an external polarity control signal EXT_POL input thereto and transmits the burn-in polarity control signal BI_POL as an internal polarity control signal iPOL. The external load signal EXT_LOAD, the external data EXT_DATA and the external polarity control signal EXT_POL are provided to pins of the TFT-LCD source driver. The internal load signal iLOAD, the internal data iDATA, and the internal polarity control signal iPOL carry out the same functions as the external load signal EXT_LOAD, the external data EXT_DATA, and the external polarity control signal EXT_POL in a self burn-in test mode.

The digital-analog converting unit 440 includes first through Mth digital-analog converters 441, 442, 443, and 444, where M is equal to the number of channels of the TFT-LCD source driver. The first through Mth digital-analog converters 441, 442, 443, and 444 receive the internal data iDATA and the internal polarity control signal iPOL and convert them into analog signals. The analog signals output from the first through Mth digital-analog converters 441, 442, 443, and 444 are sent to first through Mth channels Y1 through Y(M) through the output driver unit 450 and the second switching unit 460. Here, the second switching unit 460 transmits output signals of output drivers 451, 452, 453, and 454 of the output driver unit 450 to the channels Y1 through Y(M) in response to the internal load signal iLOAD.

The TFT-LCD source driver according to an exemplary embodiment of the present invention sends an analog output signal that is the burn-in data BI_DATA to all the channels of the TFT-LCD source driver in response to a single clock signal CLK. The gray level of the burn-in data BI_DATA is sequentially increased from 0 to the highest level for every one clock, two clocks, or predetermined number of clocks. If the burn-in data BI_DATA is generated for every two clocks and there are 64 gray levels, 128 clock signals CLK are required when the burn-in polarity signal BI_POL is at a certain logic level, for example, a logic high level. When the burn-in polarity signal BI_POL is shifted to a logic low level, 128 clock signals CLK are also needed in order to test the 64 gray levels.

Accordingly, the TFT-LCD source driver of the present invention requires a total of 256 clock signals CLK for the burn-in test while the conventional burn-in test needs 16,384 clock signals. Thus, the present invention reduces a period of time required for the test. Furthermore, the burn-in control signals BI_LOAD and BI_POL and the burn-in data BI_DATA are automatically generated in the TFT-LCD driver so that operations for generating the signals can be omitted.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A burn-in test method for a thin film transistor liquid crystal display (TFT-LCD) source driver, comprising:

generating a self burn-in test signal;

initializing the source driver in response to the self burn-in test signal to generate a polarity control signal at a first logic level and a burn-in data signal at a first gray level;

outputting a driving voltage corresponding to the first gray level to all channels of the source driver;

increasing the first gray level by 1 and outputting a driving voltage corresponding to the increased gray level to all the channels of the source driver; and repeating the step of increasing the first gray level by 1 and outputting a driving voltage corresponding to the increased gray level to all the channels of the source driver until the gray level reaches a highest gray level.

2. The burn-in test method as claimed in claim 1, wherein the polarity control signal is at the first logic level so that a positive driving voltage is output to all the channels of the source driver.

3. The burn-in test method as claimed in claim 1, further comprising:

generating a polarity control signal at a second logic level;

outputting a driving voltage corresponding to the first gray level to all the channels of the source driver;

increasing the first gray level by 1 and outputting a driving voltage corresponding to the increased gray level to all the channels of the source driver; and repeating the step of increasing the first gray level by 1 and outputting a driving voltage corresponding to the increased gray level to all the channels of the source driver until the gray level reaches the highest gray level.

4. The burn-in test method as claimed in claim 3, wherein the polarity control signal is at the second logic level so that a negative driving voltage is output to all the channels of the source driver.

5. The burn-in test method of claim 1, further comprising:

disabling external signals input to the source driver.

* * * * *